United States Patent
Kim et al.

(10) Patent No.: US 9,502,438 B2
(45) Date of Patent: Nov. 22, 2016

(54) ARRAY SUBSTRATE AND MANUFACTURING AND REPAIRING METHOD THEREOF, DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Jaikwang Kim, Beijing (CN); Yongjun Yoon, Beijing (CN)

(73) Assignees: BOE Technology Group Co., Ltd., Beijing (CN); Hefei BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 14/426,003

(22) PCT Filed: May 14, 2014

(86) PCT No.: PCT/CN2014/077470
§ 371 (c)(1),
(2) Date: Mar. 4, 2015

(87) PCT Pub. No.: WO2015/100912
PCT Pub. Date: Jul. 9, 2015

(65) Prior Publication Data
US 2016/0013211 A1  Jan. 14, 2016

(30) Foreign Application Priority Data
Dec. 31, 2013 (CN) .......................... 2013 1 0753770

(51) Int. Cl.
*H01L 27/14* (2006.01)
*H01L 27/12* (2006.01)
(Continued)

(52) U.S. Cl.
CPC ....... *H01L 27/124* (2013.01); *G02F 1/136259* (2013.01); *H01L 21/77* (2013.01);
(Continued)

(58) Field of Classification Search
CPC .......................... H01L 27/1214; H01L 27/12
USPC ............................................. 257/72; 438/618
See application file for complete search history.

(56) References Cited

U.S. PATENT DOCUMENTS

| | | | |
|---|---|---|---|
| 6,839,096 B1* | 1/2005 | Jeong | G02F 1/136259 349/139 |
| 2007/0045625 A1* | 3/2007 | Chen | G02F 1/136259 257/59 |

(Continued)

FOREIGN PATENT DOCUMENTS

| | | |
|---|---|---|
| CN | 101446724 A | 6/2009 |
| CN | 101510035 A | 8/2009 |

(Continued)

OTHER PUBLICATIONS

Chinese Office Action in Chinese Application No. 201310753770.9 mailed Jan. 20, 2016 with English translation.

(Continued)

*Primary Examiner* — Jami M Valentine
(74) *Attorney, Agent, or Firm* — Collard & Roe, P.C.

(57) ABSTRACT

An array substrate and manufacturing thereof are provided. The array substrate comprises gate lines, first data lines, second data lines and N×M pixel units defined by the gate lines intersecting with the first data lines and the second data lines. A repairing line for each column of the pixel units is provided for a region at which at least one row of pixel units are located. Projections of two ends of the repairing line on the substrate respectively overlap with regions at which the first data line and the second data line of the same column of pixel units are located, and the repairing line is isolated from the first data line and the second data line.

21 Claims, 5 Drawing Sheets

(51) Int. Cl.
*H01L 21/77* (2006.01)
*G02F 1/1362* (2006.01)
(52) U.S. Cl.
CPC ............... *H01L27/1259* (2013.01); *G02F 2001/136263* (2013.01); *G02F 2001/136272* (2013.01); *H01L 2924/0002* (2013.01)

(56) References Cited

U.S. PATENT DOCUMENTS

| | | | |
|---|---|---|---|
| 2007/0052878 A1* | 3/2007 | Song | G02F 1/136259 349/54 |
| 2009/0296013 A1 | 12/2009 | Liu et al. | |
| 2010/0265424 A1* | 10/2010 | Chiu | G02F 1/136259 349/54 |

FOREIGN PATENT DOCUMENTS

| | | |
|---|---|---|
| CN | 201886251 U | 6/2011 |
| CN | 103745970 A | 4/2014 |
| CN | 203644782 U | 6/2014 |
| KR | 20020041183 A | 6/2002 |

OTHER PUBLICATIONS

International Search Report and Written Opinion of the International Searching Authority with Notice of Transmittal of the International Search Report and Written Opinion of PCT/CN2014/077470 in Chinese, mailed Sep. 19, 2014.

English translation of the International Preliminary Report on Patentability and Written Opinion of the International Searching Authority of PCT/CN2014/077470, issued Jul. 5, 2016.

* cited by examiner

ARRAY SUBSTRATE AND MANUFACTURING AND REPAIRING METHOD THEREOF, DISPLAY DEVICE

CROSS REFERENCE TO RELATED APPLICATIONS

This application is the National Stage of PCT/CN2014/077470 filed on May 14, 2014, which claims priority under 35 U.S.C. §119 of Chinese Application No. 201310753770.9 filed on Dec. 31, 2013, the disclosure of which is incorporated by reference.

TECHNICAL FIELD

Embodiments of the present invention relate to an array substrate and a manufacturing method and a repairing method thereof, and a display device.

BACKGROUND

Large size display panels usually use a 120 Hz refresh frequency. For a pixel, when it is charged, the frequency is a half of the refresh frequency (that is 60 Hz). Therefore, if the charging time is short, it would occur bad display caused by insufficient charging.

For solving the above problem, the large size display panels usually use a structure as shown in FIG. 1; two adjacent gate lines G1 and G2 and two adjacent data lines D1 and D2 for charging a same column of pixel electrodes 3 define a pixel unit. The pixel unit includes a pixel electrode 3 and a thin film transistor TFT connected with the pixel electrode 3. The two data lines D1 and D2 are used to charge the same column of pixel electrodes, that is, to chare the pixel electrodes 3. When charging, the gate lines G1 and G2 of two rows of pixel units are simultaneously activated, and the two data lines used to charge the same column of pixel units input signals simultaneously so that two pixel units are refreshed simultaneously, thereby to double the refresh rate and halve the refresh time.

Referring to FIG. 1, for example, the gate lines G1 and G2 are simultaneously activated, and the data lines D1 and D2 input signals simultaneously, a first pixel unit in a first row and a first pixel unit in a second row as shown in FIG. 1 are charged simultaneously; that is, two rows of pixel units can be charged each time, given that the charging time of an individual pixel unit is constant, the time for refreshing the whole screen is halved with respect to the way of charging one row of pixel units each time.

However, when the data line is broken or a short circuit exists between the data line and the gate line on the array substrate, the usually processing way is to cut the bad data line and use a peripheral circuit located outside of the display region to connect with the parts of the data line behind a broken point, thereby to charge the pixel units after the data line is broken. Although such repairing method is a ripening technology, it has the following problems.

The repairing speed is slow; typically, it needs several minutes to repair one data line.

The repair capacity is limited, since the limited repairing lines are reserved in the peripheral circuit of the display region; such as, two lines, it means that the whole panel would be discarded if more than two data lines are broken.

Typically, a portion of at least one pixel is needed to be made dark when repairing is performed, thereby the repairing effect is not well.

SUMMARY

At least one embodiments of the present invention provide an array substrate, which comprises gate lines, first data lines, second data lines, and N×M pixel units defined by the gate lines intersecting with the first data lines and the second data lines, where N is a total number of rows of the pixel units, and M is a total number of columns of the pixel units; the first data lines are configured to drive odd numbered pixel units in the same column of pixel units, the second data lines are configured to drive even numbered pixel units in the same column of pixel units; and a repairing line for each column of the pixel units is provided in a region at which at least one row of the pixel units are located; wherein projections of two ends of the repairing line on the substrate respectively overlap with regions at which the first data line and the second data line of the same column of pixel units are located, and the repairing line is isolated from the first data line and the second data line.

In an example, the pixel unit comprises a pixel electrode; the repairing line and the pixel electrode are formed simultaneously and are located in a same layer of the array substrate.

In an example, the repairing line is a transparent electrode film.

In an example, the two ends of the repairing line respectively extend beyond regions at which the first data line and the second data line are located, and are perpendicular to the first data line and the second data line.

In an example, the repairing line is located at a non-display region of the pixel unit.

In an example, the repairing line and the gate line are formed simultaneously and are located in a same layer of the array substrate.

In an example, the repairing line is located in a middle area of a region of the corresponding pixel unit.

In an example, for an $i^{th}$ column of pixel units, the repairing line is provided in a region at which the pixel units are located in every $n_i$ rows, where $0 \leq n_i \leq N-1$, $i=1, 2, \ldots, M$.

In an example, the value of $n_i$ is 0, 1, 2, 3, 4 or 5.

At least one embodiments of the present invention further provide a method of manufacturing an array substrate, the manufacturing method comprises forming a pattern comprising gate lines, first data lines, second data lines and N×M pixel units defined by the gate lines, the first data lines and the second data lines, where N is a total number of rows of the pixel units, M is a total number of columns of the pixel units; configuring the first data line to drive odd numbered Pixel units in the same column of pixel units, configuring the second data line to drive even numbered pixel units in the same column of pixel units; and in each column of pixel units, forming a pattern of a repairing line in the region at which at least one row of pixel units are located so that projections of two ends of the repairing line on the substrate respectively overlap with regions at which the first data line and the second data line of the same column of pixel units are located, and the repairing line is isolated from the first data line and the second data line.

In an example, the manufacturing method further comprises forming a pattern of a pixel electrode in each pixel unit, the pattern of the repairing line and the pattern of the pixel electrode are formed simultaneously in a same layer of the array substrate.

In an example, the repairing line is made of a transparent electrode film.

In an example, the two ends of the repairing line respectively extend beyond the regions at which the first data line and the second data line are located, and are perpendicular to the data lines.

In an example, the repairing line is located, at a non-display region of the pixel unit.

In an example, the pattern of the repairing line and a pattern of the gate lines are formed simultaneously in a same layer of the array substrate.

In an example, the repairing line is located in a middle area of a region of the corresponding pixel unit.

In an example, for an $i^{th}$ column of pixel units, the repairing line is provided in a region at which the pixel units are located in every $n_i$ rows, where $0 \le n_i \le N-1$, $i=1, 2, \ldots, M$.

In an example, the value of $n_i$ is 0, 1, 2, 3, 4 or 5.

At least one embodiments of the present invention further provide a method of repairing the array substrate, the repairing method comprises connecting the part, away from the drive circuit, of the broken data line with another data line configured to drive the same column by the repairing line.

In an example, the repairing method comprises connecting the repairing line with the data line by laser welding or vapor deposition.

At least one embodiments of the present invention further provide a display device comprising the array substrate.

BRIEF DESCRIPTION OF THE DRAWINGS

Embodiments of the present invention will be described in detail hereinafter in conjunction with accompanying drawings to allow one of ordinary skill in the art to understand the present invention more clearly, in which.

DETAILED DESCRIPTION

In order to make objects, technical solutions and advantages of the embodiments of the invention apparent, technical solutions according to the embodiments of the present invention will be described clearly and completely as below in conjunction with the accompanying drawings of embodiments of the present invention. It is apparent that the described embodiments are only a part of but not all of exemplary embodiments of the present invention. Based on the described embodiments of the present invention, various other embodiments can be obtained by those of ordinary skill in the art without creative labor and those embodiments shall fall into the protection scope of the present invention.

Unless otherwise defined, all the technical and scientific terms used herein have the same meanings as commonly understood by one of ordinary skill in the art to which the present invention belongs. The terms, such as "first," "second" or the like, which are used in the description and the claims of the present application, are not intended to indicate any sequence, amount or importance, but for distinguishing various components. Also, the terms, such as "a/an," "one," "the/said" or the like, are not intended to limit the amount, but for indicating the existence of at lease one. The terms, such as "comprise/comprising," "include/including" or the like, are intended to specify that the elements or the objects stated before these terms encompass the elements or the objects and equivalents thereof listed after these terms, but not preclude other elements or objects. The terms, such as "on," "under," or the like, are only used to indicate relative position relationship, and when the position of the object which is described is changed, the relative position relationship may be changed accordingly.

The present invention will be further described hereinafter in conjunction with accompanying drawings and embodiments.

First Embodiment

Figure 1:
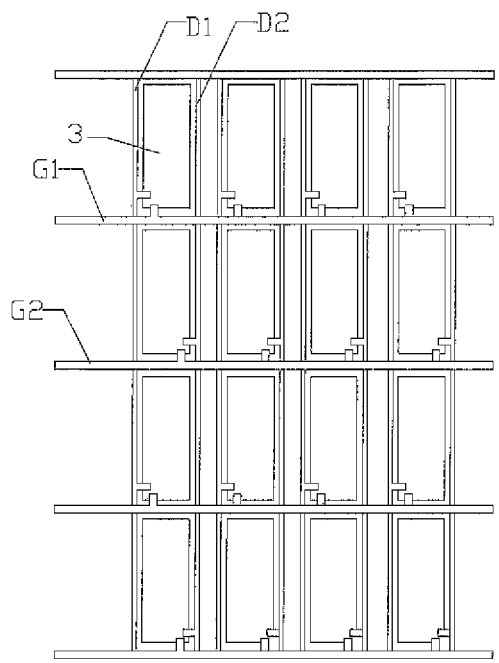
FIG. 1 is a schematic structural view of a regular array substrate.
Figure 2:
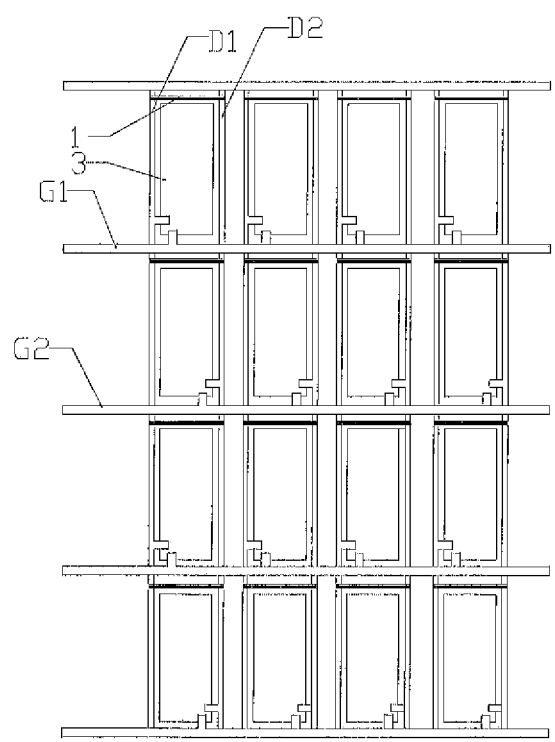
FIG. 2 is a schematic structural view of an array substrate according to an embodiment of the present invention.

As shown in FIG. 2, an array substrate of the present embodiment comprises: gate lines, first data lines, second data lines and N (rows)×M (columns) pixel units defined by the gate lines intersecting with the first data lines and the second data lines. The array substrate comprises a first data line D1 and a second data line D2, for example. The first data line is configured to drive odd numbered pixel units in a same column of pixel units, the second data line is configured to drive even numbered pixel units in the same column of pixel units. A repairing line 1 for each column of the pixel units is provided in a region at which at least one row of the pixel units are located.

Projections of two ends of the repairing line on the substrate respectively overlap with regions at which the first data line and the second data line of the same column of pixel units are located, and the repairing line is isolated from the first data line D1 and the second data line D2. That is, the repairing line 1 is located at a different layer from that of the first data line D1 and the second data line D2 are located, and an insulating layer is disposed between the different layers.

The pixel unit comprises a pixel electrode 3. For example, the repairing line 1 and the pixel electrode 3 are formed simultaneously and located in a same layer of the array substrate. For example, material of the repairing line 1 is the same as that of the electrode 3, and both of them are transparent electrode film. For example, for facilitating pattern layout, the repairing line 1 is perpendicular to the first data line D1 and the second data line D2. For example, for avoiding affecting the display of the pixel units, the repairing line 1 can be located in a non-display region of the pixel unit. For example, for welding firmly when repairing is performed, the two ends of the repairing line 1 leave a surplus respectively, that is, the two ends of the repairing line 1 extend beyond the regions at which the first data line and the second data line are located a certain length. For example, the excess length is equal to an absolute value of a tolerance existed in the process of forming the repairing line. It is understood that different forming processes have different tolerances.

For taking into account of aperture ratio, and since a probability of one data line being broken or having short circuit with the gate lines at a portion corresponding to each pixel unit is very small, it is not necessarily that the repairing line 1 is provided in a region at which each pixel unit is located. For example, for an $i^{th}$ column of pixel units, a repairing line is provided in a region at which the pixel units are located in every other $n_i$ rows, where $0 \le n_i \le N-1$, N is a total number of rows of the pixel units, $i=1, 2, \ldots, M$, and M is a total number of columns of the pixel units. The number of $n_i$ can be same or different in each column pixel units.

For example, the number of $n_i$ is 0, 1, 2, 3, 4 or 5. When $n_i$ is 0, the region at which each pixel unit is located is provided with one repairing line 1 so that the data line can be repaired when it is broken or has a short circuit with the gate line at a portion corresponding to each pixel unit. In fact, a probability of every data line being broken or having short circuit with the gate lines at the portion corresponding to each pixel unit is very small, thus one repairing line can be provided every few rows of pixel units. For example, $n_i$ is 2, 3, 4 or 5 so that the data line can be repaired and the aperture ratio is kept relatively high.

Although the accompanying drawings show that the region at which each pixel unit is located is provided with a repairing line, it is only an exemplary, and the present invention is not limited thereto.

When the array substrate is in a good condition, the repairing line 1 is not connected with the first data line D1 and the second data line D2. Since the array substrate usually comprises an insulating layer, the repairing line 1 and the first data line D1 and the second data line D2 are respectively disposed at two sides of the insulating layer so that the repairing line 1 is well isolated from the first data line D1 and the second data line D2.

When the array substrate is in a bad condition, especially when the first data line D1 or the second data line D2 is broken or the first data line D1 has a short circuit with the gate line G1 or G2, the data line can be quickly repaired.

Figure 3:
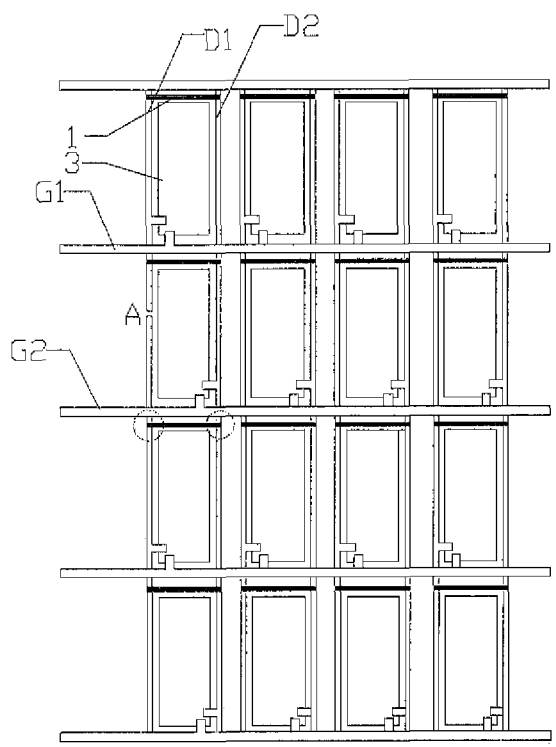
FIG. 3 is a schematic view of the array substrate of FIG. 2 being repaired.

When the first data line D1 is broken at point A in FIG. 3, it is apparent that the signal of the first data line D1 cannot be transmitted to the pixel units behind the point A (the lower portion of FIG. 3), and it only needs that the two ends of one repairing line behind the point A (the lower portion of FIG. 3) are respectively welded to the first data line D1 and the second data line D2 (the welding points are shown by circles in FIG. 3), so that the signal of the second data line D2 is transmitted to the pixel units behind the point A of the first data line D1, and the repairing is achieved.

When the first data line D1 has a short circuit with the gate line G1 or G2, it usually needs to cut the first data line D1 firstly. When the first data line D1 is cut from the two ends of the short-circuited point of the gate line G1 or G2, the gate line can work normally, then the portion, behind the broken point, of the data line is connected with the second data line D2 in the same column of pixel units through the repairing line 1 so that the signal of the second data line is transmitted to the portion of the cut data line behind the broken point for providing a signal to the column of pixel units behind the broken point, such as a voltage signal, thereby to achieve the repairing.

After the repairing, to allow the array substrate working normally, its drive manner usually needs to be changed to a manner which opens one row of pixel units each time, that is, only one gate line is scanned each time and the data line which is not broken or is not short-circuited is used to charge the pixel electrode. Alternatively, for the circuits before the broken point or short-circuited point on the data line, two rows of pixel units are opened each time; and for the circuits behind the broken point or short-circuited point on the data line, one row of pixel units are opened each time.

According to the array substrate of the present embodiment, it is only the bad place that is involved when repairing is performed, which has advantages, such as simplifying the repairing process and increasing the repairing efficiency. In contrast, for a repairing method of using peripheral circuit(s), it firstly needs to determine a bad place, then find a repairing circuit line in the peripheral circuit when the repairing is performed. Therefore, this repairing method has the following disadvantages, such as the array substrate having a large displacement during the repairing process, a long repairing time and low repairing speed due to tedious addressing.

According to the array substrate of the present embodiment, if the region of each pixel unit is provided with a repairing line, each of pixel units can be repaired, which can repair a lot of badness, reduce the scrap rate, improve repairing rate, reduce production cost and improve economic efficiency.

According to the array substrate of the present embodiment, the pixel region does not need to be cut and the bad portion does not need to be made dark when repairing is performed, thereby the repairing effect is excellent.

According to the array substrate of the present embodiment, the repairing line 1 and the pixel electrode 3 can be made simultaneously. For example, it can be achieved by changing the mask of making the pixel electrode, thus the manufacturing processes are reduced and simplified.

The repairing line 1 is a transparent electrode film. Due to the transmittance of the transparent electrode film, the array substrate has a relative high aperture ratio.

Second Embodiment

Figure 4:
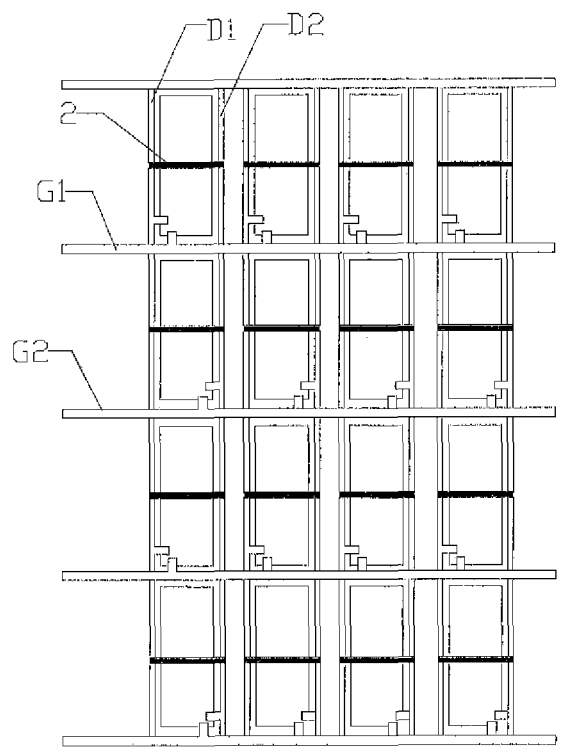
FIG. 4 is a schematic structural view of another array substrate according to an embodiment of the present invention.

As shown in FIG. 4, the array substrate of the present embodiment comprises a first data line D1 and a second data line D2. The first data line D1 is configured to drive odd numbered pixel units in a same column of pixel units, the second data line D2 is configured to drive even numbered pixel units in the same column of pixel units; and a repairing line 2 for each column of the pixel units is provided in a region at which at least one row of the pixel units are located.

The projections of two ends of the repairing line 2 on the substrate respectively overlap with regions at which the first data line D1 and the second data line D2 of the same column of pixel units are located, and the repairing line 2 is isolated from the first data line D1 and the second data line D2.

The array substrate further comprises gate lines (for example, gate lines G1, G2). For facilitating production, the repairing line 2 and the gate lines G1, G2 are formed simultaneously and located in a same layer of the array substrate. For example, the repairing line 2 and the gate lines G1, G2 are formed simultaneously by changing the mask for forming the gate lines. For facilitating pattern layout, the repairing line 2 is perpendicular to the first data line D1 and the second data line D2. For example, for welding firmly when the repairing is performed, the two ends of the repairing line 2 leave a surplus respectively, that is, the two ends of the repairing line 2 extend beyond the regions at which the first data line D1 and the second data line D2 are located.

As a further improvement to the present embodiment, the repairing line 2 is located in a middle area of a region of the corresponding pixel unit. The repairing line 2 is located in the middle area of the region of the corresponding pixel so as to avoid possible short circuit due to the repairing line being close to the gate line, and minimize the effect of opaque repairing line on the light transmittance of the panel.

For taking into account of aperture ratio, and since a probability of a data line being broken or having short circuit with the gate lines at the portion corresponding to each pixel unit is very small, it is not necessarily that the repairing line 2 is provided in a region at which each pixel unit is located. For example, for the i column of pixel units, a repairing line is provided in a region at which the pixel units are located in every $n_i$ rows, where $0 \leq n_i \leq N-1$, N is a total number of rows of the pixel units, i=1, 2, . . . , M, and M is a total number of columns of the pixel units. The number of $n_i$ can be same or different in each column pixel units.

For example, the value of $n_i$ can be 0, 1, 2, 3, 4 or 5; where $n_i$ is 0, the region at which each pixel unit is located is provided with a repairing line 2 so that the data line can be repaired when it is broken or has a short circuit with the gate line at the portion corresponding to each pixel unit. In fact, a probability of a data line being broken or having short circuit with the gate lines at the portion corresponding to each pixel unit is very small, thus a repairing line can be provided in every few rows of pixel units. For example, $n_i$ is 2, 3, 4 or 5 so that the data line can be repaired and the aperture ratio is kept relatively high.

In the present embodiment, the principle for repairing the array substrate is similar to that of the First Embodiment, so it is not repeated here.

Third Embodiment

The present embodiment provide a method of manufacturing an array substrate, the method comprises forming a pattern comprising a gate line, a first data line and a second data line. The first data line is configured to drive odd numbered pixel units in a same column of pixel units, the second data line is configured to drive even numbered pixel units in the same column of pixel units. The manufacturing method further comprises forming a pattern of a repairing line in the region at which at least one row of pixel units are located in each column of pixel units.

For example, projections of two ends of the repairing line on the substrate respectively overlap with regions at which the first data line and the second data line of the same column of pixel units are located, and the repairing line is isolated from the first data line and the second data line.

The process of manufacturing the array substrate usually uses a pattern process. The pattern process comprises forming material film, applying photoresist, exposing, developing and etching and the like.

Figure 5:
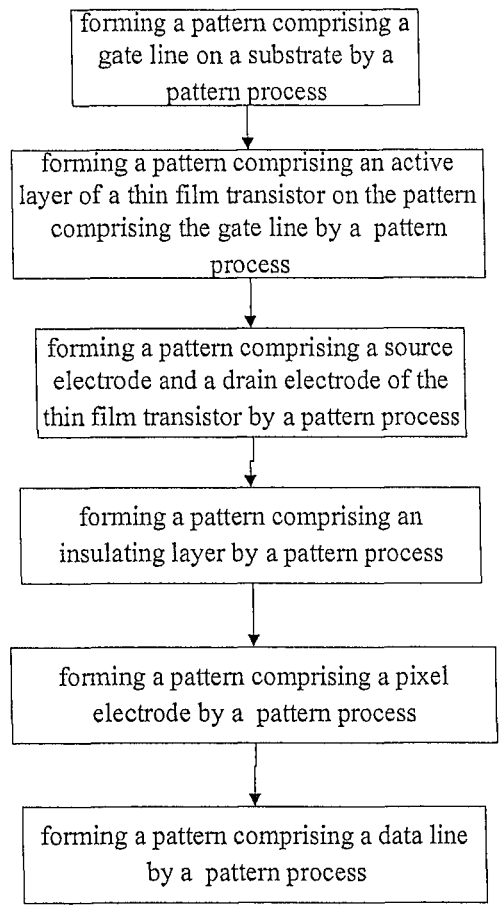
FIG. 5 is a flow chart of a method of manufacturing a regular array substrate.

FIG. 5 shows a method of manufacturing an array substrate, the manufacturing method comprises the following steps:

forming a pattern comprising a gate line on a substrate by a pattern process;

forming a pattern comprising an active layer of a thin film transistor on the pattern comprising the gate line by a pattern process;

forming a pattern comprising a source electrode and a drain electrode of the thin film transistor by a pattern process;

forming a pattern comprising an insulating layer by a pattern process;

forming a pattern comprising a pixel electrode by a pattern process;

forming a pattern comprising a data line by a pattern process.

The array substrate formed in FIG. 5 is an array substrate of a bottom gate type.

The array substrate of the present embodiment can also be a top gate type, so the order of manufacturing steps may be different.

Since a repairing line is introduced into the manufactured array substrate according to the present embodiment, the method also comprises a step of forming the repairing line when the array substrate is manufactured.

In the method of manufacturing the array substrate according to the present embodiment, a method of manufacturing a repairing line comprises, for example, forming a pattern comprising a repairing line further comprises forming a pattern comprising a pixel electrode; that is, the repairing line and the pixel electrode are formed simultaneously. For example, the pattern structure of the mask is correspondingly changed according to the distribution of the repairing lines in the original process of manufacturing pixel electrodes, then the photoresist is exposed. The photoresist at which the repairing line is located is remained when the development is performed, then the exposed etching material is removed by an etching process. As can be seen, the manufacturing process is simple.

Figure 6:
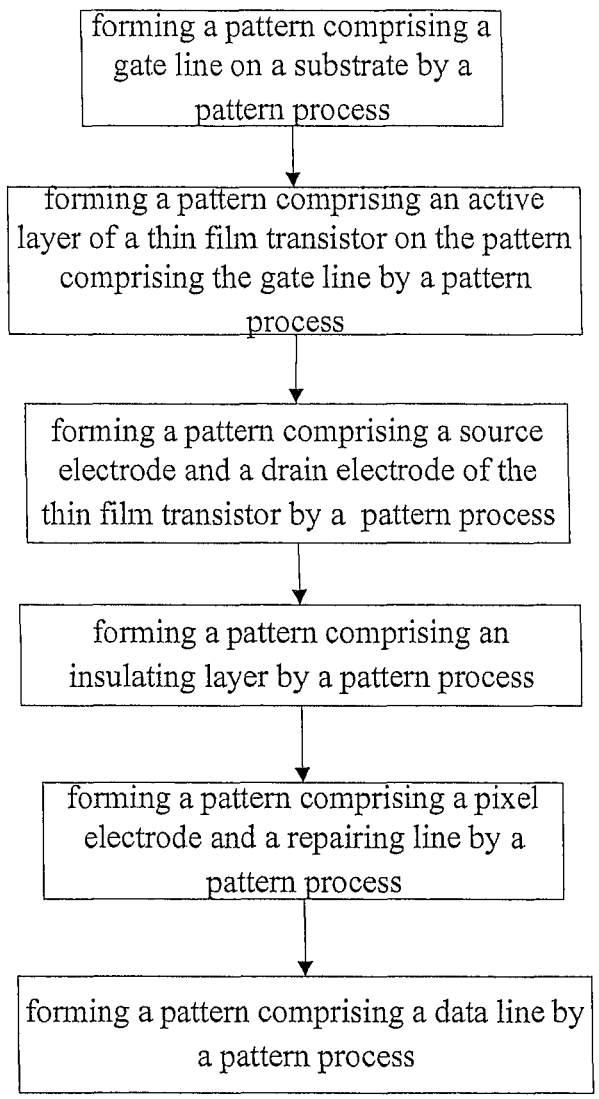
FIG. 6 is a first flow chart of a method of manufacturing an array substrate according to an embodiment of the present invention.

Therefore, corresponding to the method of forming a repairing line, if based on the method of manufacturing the array substrate as shown in FIG. 5, the method of manufacturing the array substrate according to the present embodiment is shown as FIG. 6, which comprises:

forming a pattern comprising a gate line on a substrate by a pattern process;

forming a pattern comprising an active layer of a thin film transistor on the pattern comprising the gate line by a pattern process;

forming a pattern comprising a source electrode and a drain electrode of the thin film transistor by a pattern process;

forming a pattern comprising an insulating layer by a pattern process;

forming a pattern comprising a pixel electrode and a repairing line by a pattern process; and forming a pattern comprising a data line by a pattern process.

The repairing line and the pixel electrode formed by this method are located in a same layer of the array substrate, and material of the repairing line is the same as that of the pixel electrode. For example, both of them are formed of a transparent electrode film. For facilitating pattern layout, the repairing line 1 is perpendicular to the first data line D1 and the second data line D2. For avoiding affecting the display of the pixel units, the repairing line 1 can be located in a non-display region of the pixel unit. For example, for welding firmly when repairing is performed, two ends of the repairing line 2 leave a surplus respectively so that the two ends of the repairing line 2 extend beyond the regions at which the first data line D1 and the second data line D2 are located.

Figure 7:
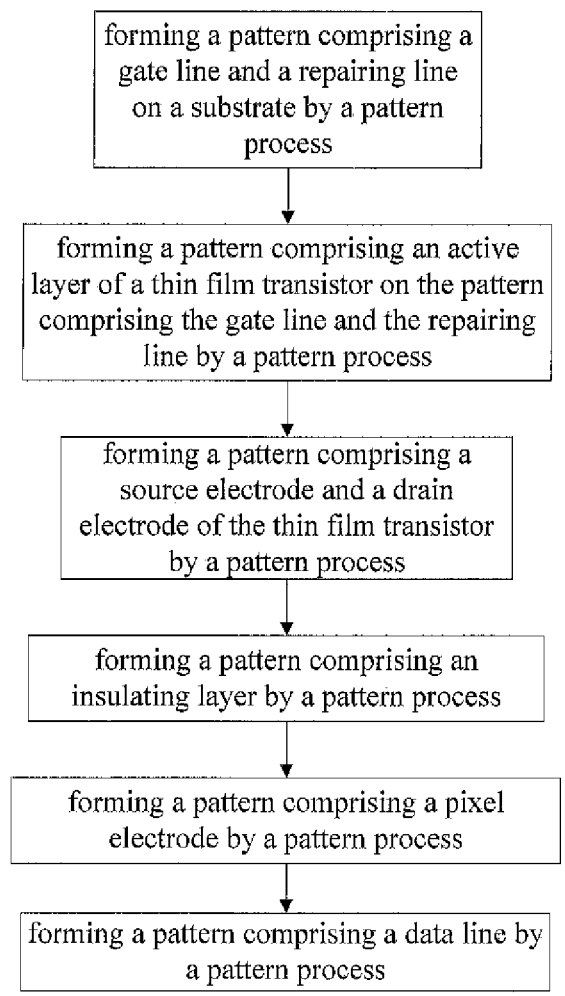
FIG. 7 is a second flow chart of a method of manufacturing an array substrate according to an embodiment of the present invention.

Another method of forming the repairing line comprises: forming a pattern comprising a repairing line further comprises forming a pattern comprising a gate line; that is, the repairing line and the gate line are formed simultaneously. With respect to a conventional process, the method can form a required repairing line by changing a mask, which also has an advantage of simple manufacturing process. If based on the manufacturing method of the array substrate as shown in FIG. 5, the method of manufacturing the array substrate according to the present embodiment is shown as FIG. 7, which comprises:

forming a pattern comprising a gate line and a repairing line on a substrate by a pattern process;

forming a pattern comprising an active layer of a thin film transistor on the pattern comprising the gate line and the repairing line by a pattern process;

forming a pattern comprising a source electrode and a drain electrode of the thin film transistor by a pattern process;

forming a pattern comprising an insulating layer by a pattern process;

forming a pattern comprising a pixel electrode by a pattern process; and forming a pattern comprising a data line by a pattern process.

By using this method, the repairing line and the gate line are located in a same layer of the array substrate.

As can be seen, if the first method is used, the repairing line and the pixel electrode can be formed of a same transparent electrode film. It is convenient to get material and the aperture ratio of the array substrate is not reduced.

If the second method is used, and the repairing line is located in a middle area of a region of the corresponding pixel unit, it will not lead to local darker when the repairing line is located in the middle area of the region of the corresponding pixel, which has best brightness, because the repairing line and the gate line are formed simultaneously. For example, for facilitating pattern layout, the repairing line can be perpendicular to the first data line and the second data line.

For taking into account of aperture ratio, and since a probability of a data line being broken or having short circuit with the gate lines at a portion corresponding to each pixel unit is very small, the repairing line 1 is not provided in the region at which each pixel unit is located. For example, for the i column of pixel units, the repairing line is provided in the region at which the pixel units are located in every $n_i$ rows, where $0 \leq n_i \leq N-1$, N is a total number of rows of the pixel units, i=1, 2, . . . , M, and M is a total number of columns of the pixel units. The number of $n_i$ can be same or different in each column pixel units.

For example, the number of $n_i$ is 0, 1, 2, 3, 4 or 5. When $n_i$ is 0, the region at which each pixel unit is located is provided with a repairing line so that the data line can be repaired when it is broken or has a short circuit with the gate line at the portion corresponding to each pixel unit. In fact, a probability of one data line being broken or having short circuit with the gate lines at the portion corresponding to each pixel unit is very small, thus a repairing line can be provided in every few rows of pixel units. For example, $n_i$ is 2, 3, 4 or 5 so that the data line can be repaired and the aperture ratio is kept relatively high.

The array substrate of the present embodiment has advantages, such as good repairing effect, simple repairing method, high repairing ratio.

Fourth Embodiment

For the array substrates according to the First and Second Embodiment, or the array substrate manufactured in the third Embodiment, a repairing method having quick repairing speed and high repairing ratio is provided. The repairing method comprises connecting the part, away from the drive circuit, of the broken data line with another data line configured to drive the same column by the repairing line. The drive source is usually arranged on the printed circuit board.

When a data line is broken, the data line behind the broken point would not receive a signal of the data line. When a data line has a short circuit with a gate line, two ends of the data line that have a short circuit with the gate line is usually cut to form a broken point for ensuring communication in the gate line. In the present embodiment, for ensuring the pixel behind the broken point is normally lighted up or off, the repairing method comprises connecting the disconnected data line behind the broken point to another data line configured to drive the same column of pixel by a repairing line, thereby to transmit the signal of another data line to the bad data line to achieve the repairing.

Under normal state, a repairing line is isolated from all of data lines, and there are insulating layers between the data line and the repairing line. The repairing line is connected with the data line by using laser welding or vapor deposition so as to achieve re-connection when the above broken point or short circuit occurs. Any other suitable welding or connecting technology can be used.

Fifth Embodiment

The embodiment of the present invention further provides a display device, which comprises the array substrate according to above first and second embodiment. The display device can be any product or component having display function, such as a liquid crystal display panel, an electric paper, an OLED panel, a mobile phone, a tablet personal computer, a television, a displayer, a laptop computer, a digital photo frame, a navigator.

The embodiments of the present invention provide the array substrate and manufacturing and repairing method thereof. A repairing line is introduced into display region of an array substrate in which two data lines are used to drive a same column of pixels. When the data line is broken or a short circuit exists between the data line and the gate line, the data line is cut and the repairing line is used to introduce signal of another data line in the same column of pixels to eliminate the bright lines or dark lines caused by the bad data line. The present invention has advantages, such as simple repairing way, high repairing speed, good repairing effect, few bad repairing data, low substrate discarding rate, good economic efficiency, and the pixel at bad region does not need to be made dark.

It is understood that the described above are only illustrative embodiments and implementations for explaining the present invention, and the present invention is not intended to limited thereto. For one of ordinary skill in the art, various modifications and improvements may be made without departing from the spirit and scope of embodiments of the present invention, and all of which should fall within the protection scope of the present invention. The scope protected by the present invention is defined by the claims.

The present application claims priority of Chinese patent application No. 201310753770.9 filed on Dec. 31, 2013 titled "Array Substrate and Manufacturing and Repairing Method thereof, Display Device", the entire content of which are incorporated herein by reference.

What is claimed is:

1. An array substrate, comprising:
gate lines;
first data lines;
second data lines; and
N×M pixel units defined by the gate lines intersecting with the first data lines and the second data lines, where N is a total number of rows of the pixel units, and M is a total number of columns of the pixel units;

the first data lines are configured to drive odd numbered pixel units in a same column of the pixel units, the second data lines are configured to drive even numbered pixel units in the same column of the pixel units; and a repairing line for each column of the pixel units is provided in a region at which at least one row of the pixel units are located;

wherein projections of two ends of the repairing line on the substrate respectively overlap with regions at which the first data line and the second data line of the same column of pixel units are located, and the repairing line is isolated from the first data line and the second data line, and wherein the pixel units each comprise a pixel electrode; and the repairing line and the pixel electrode are formed simultaneously and located in a same layer of the array substrate.

2. An array substrate, comprising:

gate lines;

first data lines;

second data lines; and

N×M pixel units defined by the gate lines intersecting with the first data lines and the second data lines, where N is a total number of rows of the pixel units, and M is a total number of columns of the pixel units;

the first data lines are configured to drive odd numbered pixel units in a same column of the pixel units, the second data lines are configured to drive even numbered pixel units in the same column of the pixel units; and a repairing line for each column of the pixel units is provided in a region at which at least one row of the pixel units are located;

wherein projections of two ends of the repairing line on the substrate respectively overlap with regions at which the first data line and the second data line of the same column of pixel units are located, and the repairing line is isolated from the first data line and the second data line, and wherein the repairing line is a transparent electrode film.

3. The array substrate according to claim 2, wherein the two ends of the repairing line respectively extend beyond regions at which the first data line and the second data line are located, and are perpendicular to the first data line and the second data line.

4. The array substrate according to claim 3, wherein the repairing line is located at a non-display region of the pixel unit.

5. The array substrate according to claim 2, wherein the repairing line and the gate lines are formed simultaneously and are located in a same layer of the array substrate.

6. The array substrate according to claim 1, wherein the repairing line is located in a middle area of a region of the corresponding pixel unit.

7. The array substrate according to claim 1, wherein for an $i^{th}$ column of the pixel units, the repairing line is provided in a region at which the pixel units are located in every $n_i$ rows, wherein $0 \leq n_i \leq N-1$, $i=1, 2, \ldots, M$.

8. The array substrate according to claim 7, wherein the number of $n_i$ is 0, 1, 2, 3, 4 or 5.

9. A method of manufacturing an array substrate, comprising:

forming a pattern comprising gate lines, first data lines, second data lines and N×M pixel units defined by the gate lines, the first data lines and the second data lines, where N is a total number of rows of the pixel units, M is a total number of columns of the pixel units, the first data lines are configured to drive odd numbered pixel units in a same column of the pixel units, and the second data lines are configured to drive even numbered pixel units in the same column of pixel units; and in each column of pixel units, forming a pattern of a repairing line in a region at which at least one row of pixel units are located so that projections of two ends of the repairing line on the substrate respectively overlap with regions at which the first data line and the second data line of the same column of the pixel units are located, and the repairing line is isolated from the first data line and the second data line.

10. The method of manufacturing the array substrate according to claim 9, further comprising forming a pattern of a pixel electrode in each pixel unit, wherein the pattern of the repairing line and the pattern of the pixel electrode are formed simultaneously in a same layer of the array substrate.

11. The method of manufacturing the array substrate according to claim 9, wherein the repairing line is formed of a transparent electrode film.

12. The method of manufacturing the array substrate according to claim 11, wherein two ends of the repairing line respectively extend beyond the regions at which the first data line and the second data line are located, and are perpendicular to the first data line and the second data line.

13. The method of manufacturing the array substrate according to claim 12, wherein the repairing line is located in a non-display region of the corresponding pixel unit.

14. The method of manufacturing the array substrate according to claim 9, wherein the pattern of the repairing line and a pattern of the gate lines are formed simultaneously in a same layer of the array substrate.

15. The method of manufacturing the array substrate according to claim 9, wherein the repairing line is located in a middle area of a region of the corresponding pixel unit.

16. The method of manufacturing the array substrate according to claim 9, wherein for an $i^{th}$ column of pixel units, the repairing line is provided in a region at which the pixel units are located in every $n_i$ rows, where $0 \leq n_i \leq N-1$, $i=1, 2, \ldots, M$.

17. The method of manufacturing the array substrate according to claim 16, wherein the number of $n_i$ is 0, 1, 2, 3, 4 or 5.

18. A display device comprising the array substrate according to claim 1.

19. The array substrate according to claim 1, wherein the repairing line is a transparent electrode film.

20. The array substrate according to claim 1, wherein the two ends of the repairing line respectively extend beyond regions at which the first data line and the second data line are located, and are perpendicular to the first data line and the second data line.

21. The array substrate according to claim 1, wherein the repairing line is located at a non-display region of the pixel unit.

* * * * *